US006740560B1

(12) United States Patent  (10) Patent No.: US 6,740,560 B1
Heinemann et al.  (45) Date of Patent: May 25, 2004

(54) BIPOLAR TRANSISTOR AND METHOD FOR PRODUCING SAME

(75) Inventors: Bernd Heinemann, Frankfurt (DE); Karl-Ernst Ehwald, Frankfurt (DE); Dieter Knoll, Frankfurt (DE)

(73) Assignee: Institut fuer Halbleiterphysik Frankfurt (Oder) GmbH, Frankfurt (DE)

( * ) Notice: Subject to any disclaimer, the term of this patent is extended or adjusted under 35 U.S.C. 154(b) by 0 days.

(21) Appl. No.: 09/857,859

(22) PCT Filed: Dec. 8, 1999

(86) PCT No.: PCT/DE99/03961
§ 371 (c)(1),
(2), (4) Date: Sep. 17, 2001

(87) PCT Pub. No.: WO00/36653
PCT Pub. Date: Jun. 22, 2000

(30) Foreign Application Priority Data

Dec. 14, 1998 (DE) .......................... 198 57 640

(51) Int. Cl.$^7$ .................... H01L 21/331; H01L 31/0328
(52) U.S. Cl. ...................... 438/309; 438/312; 438/368; 438/350; 257/197; 257/200
(58) Field of Search ................................ 438/350, 309, 438/312, 313, 364, 368, 369; 257/197, 198, 200, 201

(56) References Cited

U.S. PATENT DOCUMENTS

| | | |
|---|---|---|
| 5,583,059 A | 12/1996 | Burghartz |
| 5,589,409 A | 12/1996 | Bulucca |
| 5,620,907 A | 4/1997 | Jalali-Farahani |
| 5,648,294 A | 7/1997 | Bayraktaroglu |
| 5,656,514 A | 8/1997 | Ahlgren |
| 5,698,459 A | 12/1997 | Grubisich |
| 5,789,301 A | 8/1998 | Hill |
| 6,020,246 A * | 2/2000 | Koscielniak et al. ........ 438/341 |

FOREIGN PATENT DOCUMENTS

| | | |
|---|---|---|
| DE | 1 764 313 | 5/1972 |
| DE | 41 02 888 A1 | 8/1991 |
| DE | 42 40 738 A1 | 8/1993 |
| EP | 0 529 772 A1 | 3/1993 |

(List continued on next page.)

OTHER PUBLICATIONS

Comfort, et al, "Single Crystal Emitter Cap for Epitaxial Si and SiGe–base Transistors," IEDM, IEEE (USA), p. 857–60, (Dec. 11, 1991).

Gruhle, et al, "Low 1/f noise SiGe HBTs with application to low phase noise microwave oscilllators," Electronics Letters, vol. 33 (No. 24), pp. 2050–52, (Nov. 20, 1997).

(List continued on next page.)

*Primary Examiner*—Tuan H. Nguyen
(74) *Attorney, Agent, or Firm*—Hahn Loeser + Parks LLP; Stephen L. Grant (57) ABSTRACT

The aim of the invention is to provide for a bipolar transistor and a method for producing the same. Said bipolar transistor should have minimal base-emitter capacities and very good high frequency characteristics. The static characteristics, especially the base current ideality and the low frequency noise, of a bipolar transistor with weakly doped cap layer (116) should not significantly deteriorate and process complexity should not increase. According to the invention, the problem is solved by inserting a special doping profile in a cap layer (116) (cap doping) which has been produced epitaxially. A minimal base emitter capacity and very good high frequency characteristics can be obtained by means of said doping profile. At the same time, the efficiency of the generation/recombination active boundary surface between the cap layer (116) and the isolator (117) in the polysilicon overlapping area in the relevant working area of the transistor is reduced and the base current ideality is improved. The section at the base side in the cap layer (116) has a preferred thickness of between 20 nm and 70 nm and is only doped weakly, preferably less than $5 \cdot 10^{16}$ cm$^{-3}$. Said section is crucial for the good high frequency characteristics.

11 Claims, 5 Drawing Sheets

FOREIGN PATENT DOCUMENTS

| EP | 0 551 185 A2 | 7/1993 |
| EP | 0 552 561 A3 | 7/1993 |
| EP | 0 795 899 A1 | 9/1997 |
| EP | 0 818 829 A1 | 1/1998 |
| FR | 2 693 839 A1 | 1/1994 |
| JP | 620210670 AA | 8/1987 |
| JP | 0010039061 AA | 8/1989 |
| JP | 0060037105 AA | 8/1994 |
| WO | WO 98/26457 A1 | 6/1998 |

OTHER PUBLICATIONS

Chantre, et al., "A high performance low complexity SiGe HBT for BiCMOS integration," IEEE BCTM, IEEE (USA).

CHO, et al, "A 42–GHz (fmax) SiGe–Base HBT using reduced pressure CVD," Solid State Electronics, Elsevier (Great Britain), vol. 42 (No. 0), p. 1641–49, (Aug. 23, 1998).

Lombardo, et al, "Band–Gap Narrowing and High Frequency Characteristics of Si/GeSi Heterojunction Bipolar Transistors Formed by Ge Ion Implantation on Si," Transactions on Electronic Devices, IEEE (USA), vol. 45 (No. 7), p. 1531–37 (Jul. 23, 1998).

Bensahel, et al., "Single wafer processing of in situ doped polycrystalline Si and SiGe," Solid State Technology, p. S5–S10, (Mar. 23, 1998).

Hope, "Real–time control of layer thickness in LPCVD Si/Si88Ge12 HBT structures," Thin Solid Films, Elsevier (Great Brtitain), No. 294, p. 18–21, (Aug. 23, 1997).

Hueting, et al, "On the optimization of SiGe–Base Bipolar Transistors," Transactions on Electron Devices, IEEE (US), vol. 43 (No. 9), p. 1518–24, (Sep. 23, 1996).

* cited by examiner

BIPOLAR TRANSISTOR AND METHOD FOR PRODUCING SAME

The invention relates to a bi-polar transistor and a procedure, for its manufacture.

BACKGROUND OF THE ART

The implementation of epitaxially manufactured silicon-germanium hetero-bi-polar transistors (SiGe HBT) and the resulting cost-reducing simplification of the technological processes have lately provided a new impetus for a further development of Si bi-polar transistors. In this respect, the combination of an epitaxially produced base with the process-simplifying possibilities of the single polysilicon technology offers an attractive direction of development.

In comparison with conventional base profiles produced by implantation or diffusion, silicon-germanium base layers made by epitaxy allow producing, simultaneously, smaller base widths and base layer resistance without unusable small current gains or high leakage currents. The technology allows implementation of a concentration of the active doping agent of up to $1 \times 10^{20}$ cm$^{-3}$, as is described—for example—in A. Schüppen, A. Gruhle, U. Erben, H. Kibbel und U. König: *90 GHz fmax SiGe-HBTs*, DRC 94, page IIA-2, 1994. However, in order to prevent leakage currents due to tunnel processes, a low-doped region is required between the high-concentration zones of the emitter and the base. As a matter of fact, if the base doping exceeds the value of $5 \times 10^{18}$ cm$^{-3}$, and if the high concentration of the emitter reaches down to the base—as is usual with implanted base profiles—the consequence is the existence of unacceptably high tunnel currents. As opposed to implanted base profiles, the application of epitaxy allows, simultaneously and without any problems, the production of narrow base profiles and a low-doped region (cap layer).

Figure 1:
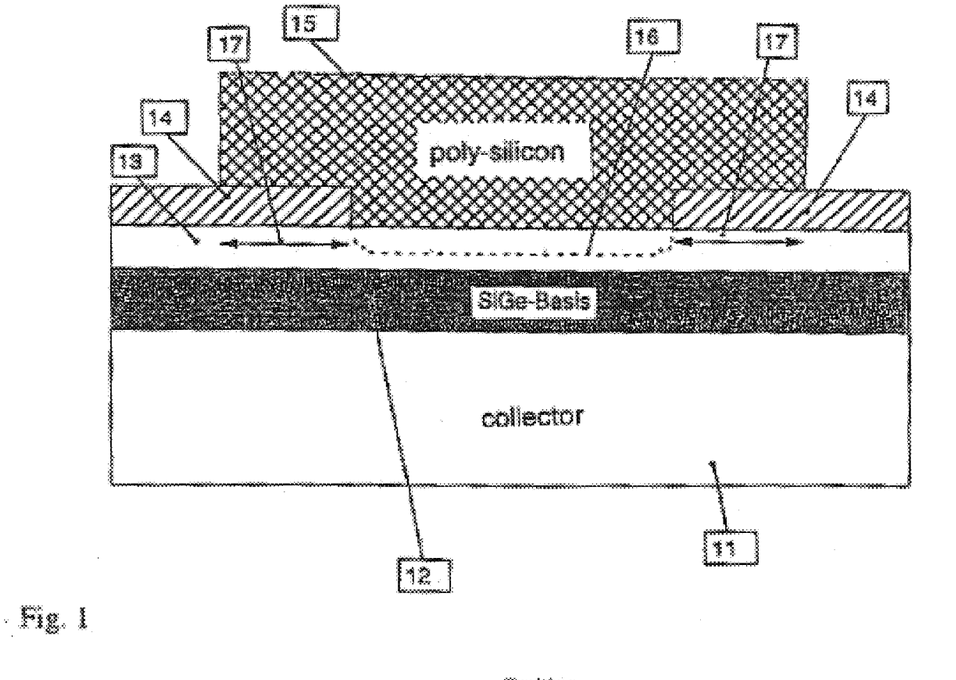
FIG. 1: A schematic illustration of the emitter zone of a bi-polar transistor manufactured with a single poly-silicon technology with an epitaxially deposited base.

FIG. 1 illustrates the emitter zone of a SiGe HBT. This transistor design reflects typical characteristics of a single poly-silicon process. An SiGe base 12 and subsequently a cap layer 13 were deposited over a monocrystal collector zone 11. FIG. 1 does not show a lateral insulation of the transistor zone. If semiconductor material grows both on the monocrystal substrate 11 and on the insulator zone—not shown in the picture—(i.e., differential epitaxy), it is possible to utilize the grown semiconductor layers as a connection between a contact on the insulation zone and the inner transistor. Such a connection should be, designed with as low impedance as possible. This is why it would be advantageous if the epitaxial layer thickness could be set up independently from the base width. A poly-silicon or an α-silicon layer 15 is deposited on an insulation layer 14, in which emitter windows were etched by means of a wet-chemical etching process. During the deposition or subsequently, the α-silicon layer 15 obtains—by implantation—a doping of the emitter's conductivity type and serves as diffusion source for the emitter doping 16 in the monocrystal substrate. Insulator layer 14 is applied in order to prevent damage to cap layer 13 during the structuring of the polycrystal α-silicon layer 15 performed later. In the overlapping region 17—a zone between the edge of the emitter window and the outer delimitation of the structured poly-silicon or α-silicon layer 15, a layer, sequence arises consisting of semiconductor material, insulator material and semiconductor material. Depending on the doping of the cap layer 13, the interfacial charges and the recombination properties of the surface as well as on the operation conditions of the transistor, this design can cause—analogous to a MOS capacity—an enhancement but also a depletion of mobile charge carriers on the surface of the cap layer 13. With a forward-current base-emitter diode, this can affect both the ideal nature of the base current and the low-frequency noise properties. Under certain circumstances, generation currents and breakdown voltage in the non-conducting direction can be affected. The condition that—due to the tunnel (currents) danger—the doping agent concentration should not exceed the value of $5 \times 10^{18}$ cm$^{-3}$ leads to the question, by means of which procedure this zone should be suitably doped. The following text discusses the variants for SiGe HBT so far known: homogeneous n-doping or p-doping near the tunnel limit or quasi undoped zones (i-zones). A. Chantre, M. Marty, J. L. Regolini, M. Mouis, J. de Pontcharra, D. Dutrtre, C. Morin, D. Gloria, S. Jouan, R. Pantel, M. Laurens and A. Monroy: *A high performance low complexity SiGe HBT for BiCMOS integration*, BCTM '98, 1998, pages 93–96 uses a p-doping of about $5 \times 10^{18}$ cm$^{-3}$. This results in a decisive disadvantage in that the thickness of, the cap layer must be set up within a tolerance range of a few nanometers from the penetration depth of the doping agent diffusing from the poly-silicon emitter layer. Greater cap layer thickness values (which would be advantageous for a low-impedance connection between the inner base and a connector in the insulation zone) are not possible since it would negatively affect the effect of the germanium profile. A. Gruhle, C. M ähner: *Low l/f noise SiGe HBTs with application to low phase noise microwave oscillators*, Electronics Letters, Vol. 33, No. 24, 1997, pages 2050–2052 uses a cap layer 100 nm thick with an n-concentration of $1$–$2 \times 10^{18}$ cm$^{-3}$. EP-A-0 795 899 indicates similar conditions, where preferably a cap layer of a thickness of 70 nm with a n-doping concentration of $2 \times 10^{18}$ cm$^{-3}$ is used. Although this variant eliminates the problem of the thickness tolerance, and avoids the danger of tunnel currents by reducing the doping agent concentration in the cap layer, it still does not take full advantage of the possibilities of reducing the base-emitter capacity.

This disadvantage can be eliminated by not doping the cap layer as is described, for example, in B. Heinemann, F. Herzel and U. Zillmann: *Influence of low doped emitter and collector regions on high-frequency performance SiGe-base HBTs*, Solid-St. Electron, 1995, Volume 38(6), pages 1183–1189. However, it can easily lead to a depletion of the aforementioned overlapping region 17. These connections are explained in further text by means of a two-dimension design element simulation.

Figure 2:
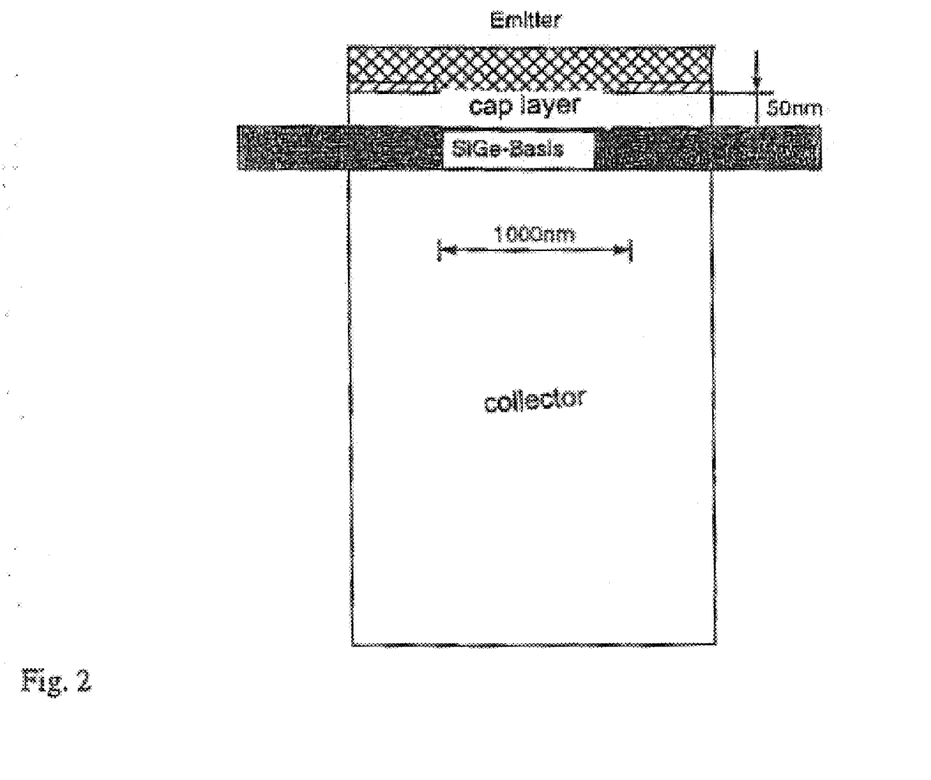
FIG. 2: A schematic illustration of the simulation region for the bi-polar transistor according to FIG. 1 (not in correct scale)
Figure 3:
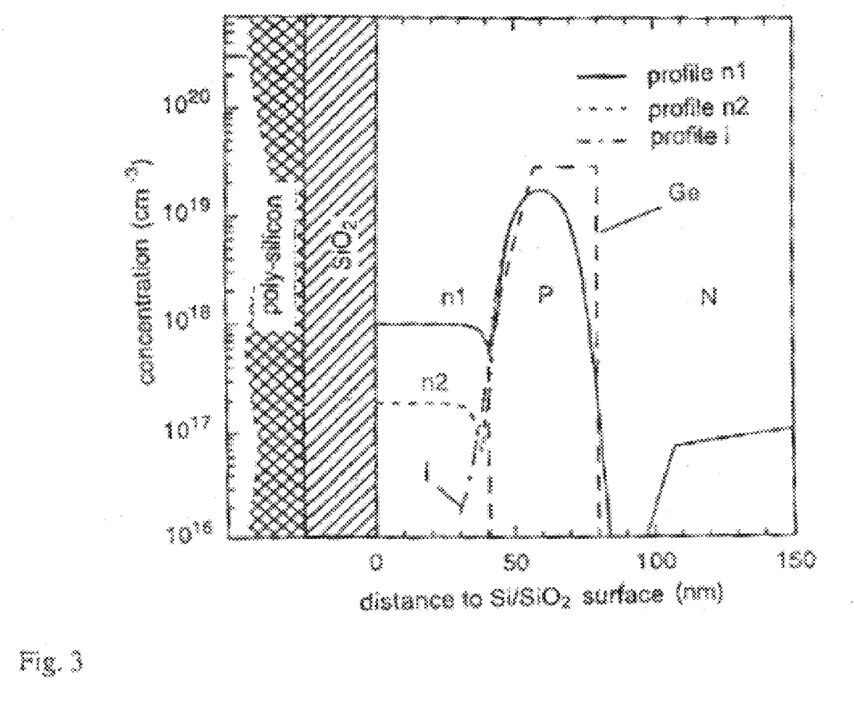
FIG. 3: Vertical doping profiles under the overlapping region for various cap doping levels.
Figure 4:
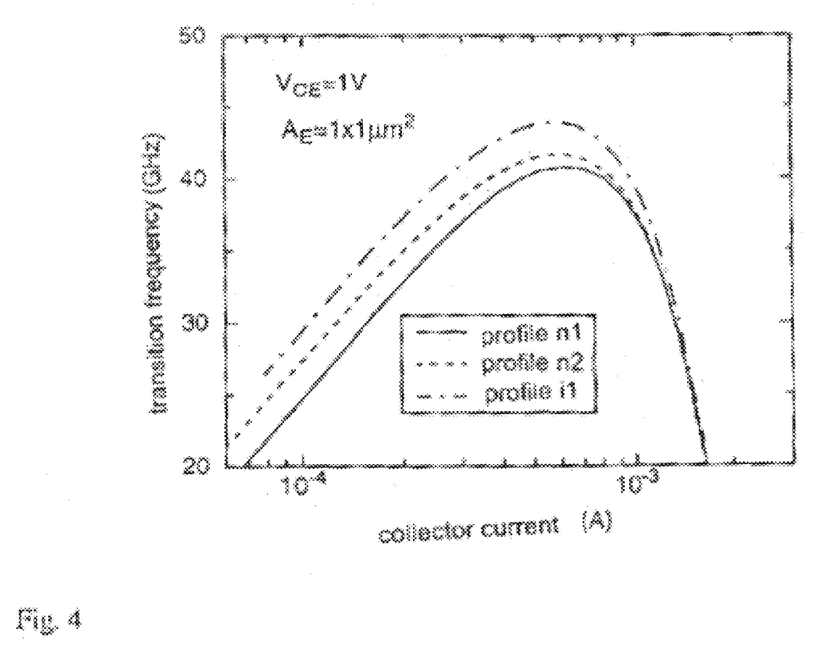
FIG. 4: Transition frequency as a function of the collector current density for various doping profiles.
Figure 5:
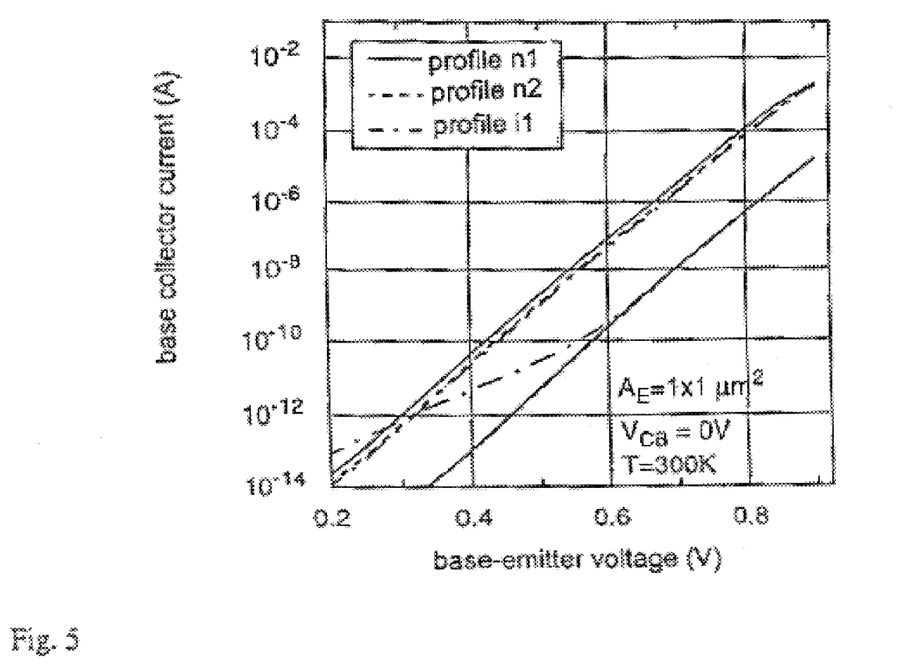
FIG. 5: Graphs for various doping profiles.

FIG. 2 shows the simplified transistor design used in the simulation. The electrical effect of the oxide semiconductor surface in the overlapping region is modeled by means of a positive surface charge density of $1 \times 10^{11}$ cm$^{-2}$ and a surface recombination speed of 1000 cm/s. FIG. 3 illustrates vertical profiles along a section line horizontal to the overlapping region. The profiles show three doping variants in the cap layer 13 and a p-doped SiGe base 12 identical for all three cases. The following cap doping cases are compared: a quasi undoped cap layer 13 (profile i) and two homogeneous n-dopings (profile n1 with $1 \times 10^{18}$ cm$^{-3}$ and profile n2 with $2 \times 10^{17}$ cm$^{-3}$). FIG. 4 shows the transition frequency as a function of the collector current for various doping variants. Especially with small collector currents, an increase in transition frequency with a falling doping level in the cap layer 13 can be noticed. While profile i provides relatively best transition frequencies, it has, however, the disadvantage that the ideal nature of the base current (FIG. 5) is noticeably affected in comparison with the other profiles.

SUMMARY OF THE INVENTION

The task of this invention is to indicate a bi-polar transistor and a procedure for its manufacture that eliminates the described disadvantages of conventional arrangements, in order to achieve especially minimal base-emitter capacities and best high-frequency properties without noticeably affecting the static properties of the bi-polar transistor with a low-doped cap layer—above all the ideal nature of the base current and low-frequency noise—and without increasing the process complexity.

This invention fulfills this task by introducing a special doping profile into an epitaxially produced cap layer (cap doping). This doping profile allows achieving a minimal base-emitter capacity and best high-frequency properties, but also restricts the effect of a generation-active and recombination-active interface between the cap layer and the insulator in the overlapping poly-silicon region in the interesting function range of the transistor, and improves the ideal nature of the base current.

Decisive for the good high-frequency properties is the base-side section in the cap layer of a preferable thickness between 20 nm and 70 nm with low-concentration doping, preferably less then $5 \times 10^{16}$ cm$^{-3}$.

On the emitter side, the cap layer is doped more highly. If the doping agent is of a conductivity type like the base layer, the doping agent concentration applied in the cap layer is preferably less than $5 \times 10^{18}$ cm$^{-3}$ in order to prevent tunnel currents.

The cap doping profile is preferably introduced by implantation in situ during the epitaxy procedure.

The characteristics of this invention are clear from the claims and also from the description and the drawings, where each characteristic—either individually or several characteristics in the form of sub-combinations—represent patentable designs, for which protection is demanded herein. Design examples are illustrated in the drawings and are explained in more detail in further text.

DETAILED DESCRIPTION OF THE INVENTION

The characteristics and effects of the cap doping profiles according to this invention are described by means of a two-dimensional element simulation on an npn SiGe HBT. The explanation can be applied to a pnp transistor accordingly.

Figure 6:
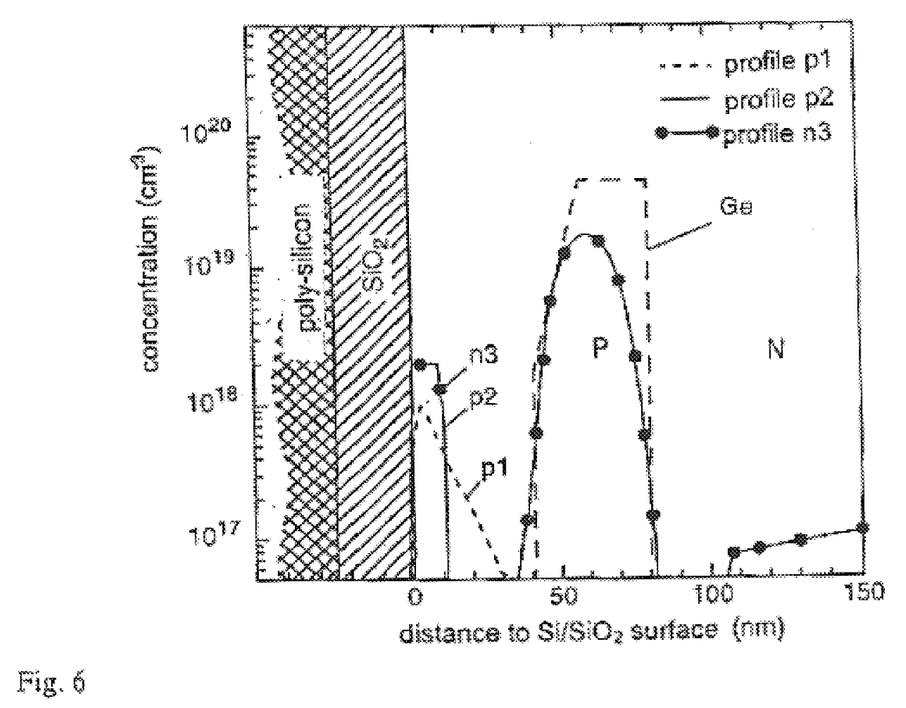
FIG. 6: Vertical doping profiles under the overlapping region for various cap doping levels.
Figure 7:
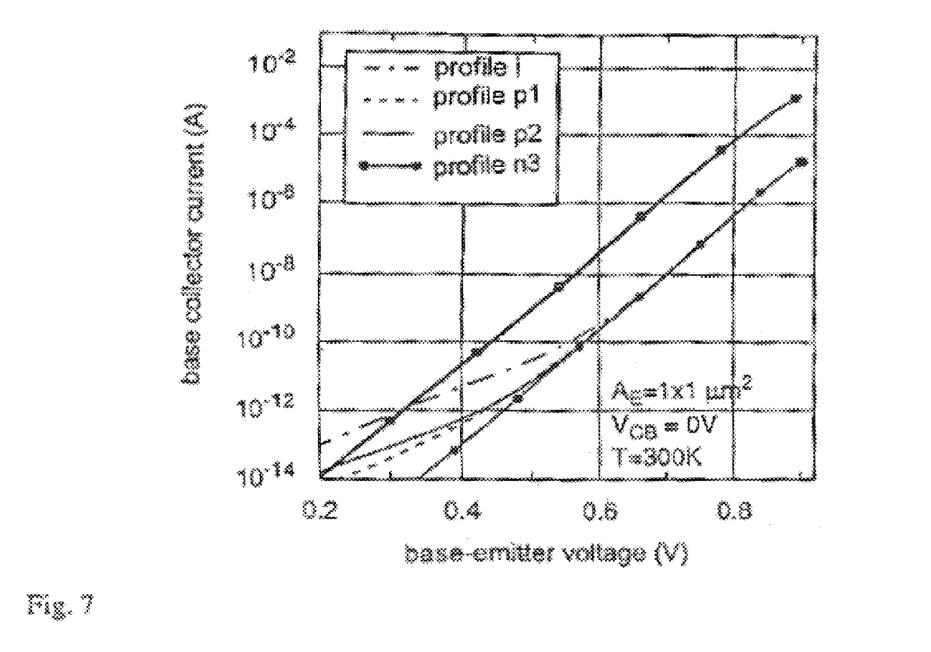
FIG. 7: Graphs for various doping profiles.
Figure 8:
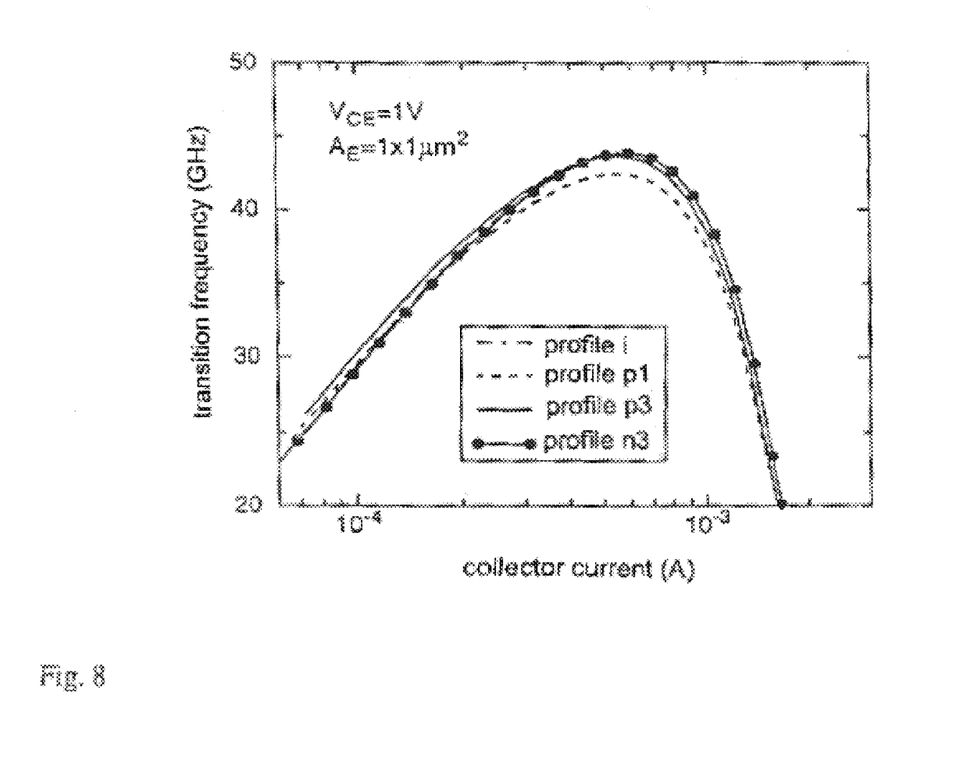
FIG. 8: Transition frequency as a function of the collector current density for various doping profiles.

FIG. 6 shows characteristic examples for the vertical profiles (as proposed herein) in the cap layer 13 along a section line horizontal to the overlapping region. The doping agent concentration of the cap "profile p1" is growing in direction to the surface of the cap layer and reaches there its maximum concentration with about $9 \times 10^{17}$ cm$^{-3}$, whereas the box-like profiles "p2" and "n3" are 10 nm wide and doped with $2 \times 10^{18}$ cm$^{-3}$. The profiles p1 p2 are of a p conductivity type, profile n3 is of n-type. FIG. 7 shows "Gummel" graphs to profiles p1, p2 and n3, when the characteristics of profile 1 from FIG. 5 were taken; over for comparison. FIG. 7 shows a clear improvement in the characteristics of the base current when cap doping is used as compared with the behavior of profile i. Dynamic calculations to these profiles lead to the results shown in FIG. 8: Unlike the homogeneous dopings n1 and n2 with concentrations of $1 \times 10^{18}$ cm$^{-3}$ and $2 \times 10^{17}$ cm$^{-3}$, profiles p1, p2 and n3 demonstrate no noticeable deterioration of transition frequencies in comparison with profile i. Decisive for the good high-frequency properties is the section in the cap layer of a preferable thickness of at least 20 nm with low-concentration doping, preferably less then $5 \times 10^{16}$ cm$^{-3}$. The results indicate that, in the example shown here, n-profiles and n-profiles in: the cap layer can achieve comparable results.

In practice, the decision which doping type should be applied depends on the circumstance, e.g., of which type and density are the charges on the Si/insulator interface or in the insulator, or which manufacturing procedure can be used for the cap doping process. So, e.g., the proposed profiles can be introduced by implantation. However, this variant should be preferred only if the effects of point defects on the base profile can be controlled. Should the curing of the point defects lead to an increased diffusion of the base doping from the SiGe layer and, therefore, to an unacceptable deterioration of the electrical properties, other doping variants are required. For example, an in situ doping during the epitaxy process is possible. During this procedure, the type of the cap doping is co-determined by the safety and simplicity of the deposition process. The following text explains the manufacturing of a bi-polar transistor according to this invention on the example of an npn SiGe HBT. The revealed procedure can, be applied to pnp transistors as well. In addition, according to this invention it is also possible not to use an epitaxy process on the base layer and, instead, introduce the base profile by implantation before the epitaxial manufacturing of the cap layer.

Figure 9:
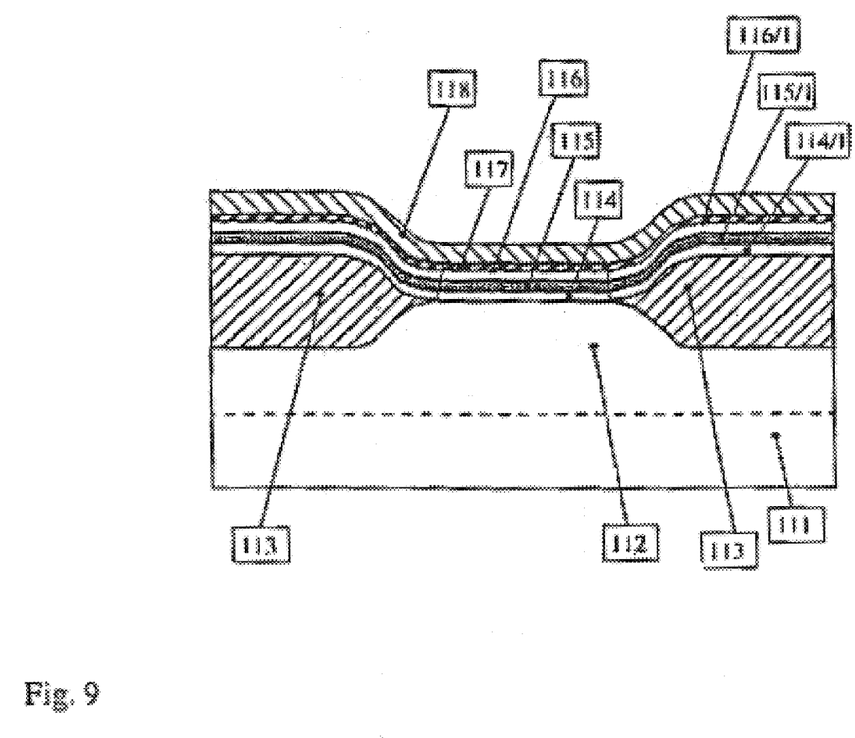
FIG. 9: A schematic illustration of a bi-polar transistor during the manufacturing process.

As illustrated in FIG. 9, structured regions consisting of a collector region 112 of the conductivity type II and an insulation region 113 (which surrounds the collector region 112) were produced on a monocrystal substrate layer 111 of the conductivity type I. If the emitter and the collector are, e.g., n-conductive, the base is of the p-type and vice versa. Various suitable insulation techniques are known such as LOCOS processes, spaced mesa arrangements or deep or flat trench insulation.

On the basis of a differential epitaxy process, a buffer layer 114, a SiGe layer with in-situ doping of the base layer 115 of the conductivity type I and a cap layer 116 are is applied on the entire surface.

While the buffer layer 114, the base layer 115 and the cap layer 116 grow—as monocrystal materials—on the silicon substrate, polycrystal layers 114/1, 115/1 and 116/1 arise over the insulation zone 113. After photolithographic masking, dry-etching techniques are applied to remove the epitaxy layer in those regions in which no transistors arise.

If a selective epitaxy process is used instead of differential epitaxy, where growth occurs exclusively on the silicon underground, the structuring of the epitaxy layer stack is eliminated.

In the following step, the silicon regions with an insulation layer 117 are exposed. This can be achieved by means of thermal oxidation and/or deposition. Layer stacks of dielectrics such as silicon oxide and silicon nitride can be applied. Besides that, the electrically conductive layer can be covered with a poly-silicon layer in order to maintain additional flexibility for the process at a later stage.

Essential from the point of view of the procedure according to this invention is the implementation of the cap doping profile in an epitaxially produced cap layer. There is a possibility to introduce similar profiles, as shown in FIG. 6, in situ during the epitaxy process. Furthermore, a flat profile can be produced by implantation before or after the production of the insulation layer 117. In addition, various procedures for the diffusion of such profiles are also known. This can also be performed by means of an insulation layer highly enriched with the doping agent. A diffusion step can occur before or after further procedure steps. The use of diffusion-preventing ingredients in the collector, the base and the cap layer 116 such as carbon is especially useful if certain processes are used such as implantation, diffusion or thermal oxidation, which can cause an accelerated diffusion of the doping agents.

The transistor manufacturing process can now proceed with the structuring of a coating mask for the opening of the emitter window. In this step, the cover layers are removed in well-known etching procedures. In order to achieve good transistor properties, preferably wet-etching techniques should be used to expose the semiconductor surface.

The process continues with the deposition of an amorphous silicon layer for the creation of a poly-silicon emitter. This layer can be doped in situ by implantation during or immediately after the deposition.

The process then continues with conventional steps of structuring, implantation and passivation. The required high-temperature steps are taken to cure implantation defects and to form the poly-emitter. The manufacturing process is completed with the opening of the contact apertures for the emitter, the base and the collector and with a standard metallization of the transistor contacts.

This invention explains, on the basis of concrete design examples, a bi-polar transistor and a procedure for its manufacture. However, notice must be taken that this invention is not restricted to the particulars of the description of any particular design example, since, within the patent claims, changes and deviations are also subject to patent protection.

What is claimed is:

1. A procedure for the manufacture or a bi-polar transistor, said procedure comprising the steps of:
   producing structured regions consisting of a collector region and an insulation region that surrounds the collector region, on a monocrystal substrate layer;
   producing a base layer and, by means of epitaxy, a cap layer over the collector region;
   depositing an insulation layer is deposited over the cap layer, the insulation layer being opened in an area of an effective emitter zone; and
   depositing and structuring a poly-Si or an α-Si layer over the opened insulation layer for use as an emitter-doping agent source and as a contact layer;
   wherein, before the diffusion from the emitter-doping agent source, a doping profile is introduced into the cap layer, and the profile is low-doped on the base side with a maximum concentration of $5\times10^{16}$ cm$^{-3}$ and highly doped on the emitter side thereof, and wherein the low-doped region of the cap layer has a thickness between 20 nm and 70 nm.

2. The procedure of claim 1, wherein the emitter-side high doping concentration of the cap layer does not exceed values of $5\times10^{18}$ cm$^{-3}$ when the doping agent is of the same conductivity type as the base layer.

3. The procedure of claim 1, wherein the cap doping profile is introduced by implantation.

4. The procedure of claim 1, wherein the cap doping profile is introduced in situ during the epitaxy process.

5. The procedure of claim 1, wherein the cap doping profile is introduced by diffusion from the insulation layer after highly enriching the insulation layer with the doping agent.

6. A bi-polar transistor, in which structured regions consisting of a collector region and an insulation region that surrounds the collector region are produced on a monocrystal substrate layer, a base layer and, by means of epitaxy, a cap layer is produced over the collector zone, an insulation layer is deposited over the cap layer, the insulation layer is opened in an area of an effective emitter zone, a poly-Si or an α-Si layer is deposited and structured over the opened insulation layer and is then used as an emitter-doping agent source and as a contact layer,
   wherein, in an overlapping region between an edge of the emitter window and the outer delimitation of the structured poly-silicon or α-silicon layer the cap layer contains a doping profile, wherein the doping profile comprises a low-doped region on the base side with a maximum doping concentration of $5\times10^{16}$ cm$^{-3}$ and a higher-doped region on the emitter side, and wherein the low-doped region of the cap layer has thickness between 20 nm and 70 nm.

7. The bi-polar transistor of claim 6, wherein the emitter-side high doping concentration of the cap layer does not exceed values of $5\times10^{18}$ cm$^{-3}$ when the doping agent is of the same conductivity type as the base layer.

8. The bi-polar transistor of claim 6, further comprising:
   a buffer layer interposed between the collector region and the base layer.

9. A procedure for manufacturing a bi-polar transistor, comprising the steps of:
   producing, on a monocrystal substrate layer, structured regions consisting of a collector region and an insulation region, the insulation region surrounding the collector region,
   producing a base layer and a cap layer over the collector region, the cap layer produced by epitaxy;
   depositing an insulation layer over the cap layer, the insulation layer opened in an area of an effective emitter zone; and
   depositing and structuring a poly-Si or an α-Si layer over the opened insulation layer, and using this layer as a source of emitter-doping agent and as a contact layer;
   wherein, before diffusing from the emitting-doping agent source, a doping profile is introduced into the cap layer, the profile being low doped on a base side thereof with a maximum doping concentration $5\times10^{16}$ cm$^{-3}$ and high doped on an emitter side thereof, and wherein the low-doped-region of the cap layer has a thickness between 20 nm and 70 nm.

10. The procedure of claim 9, further comprising the step of depositing a buffer layer between the collector region and the base layer.

11. A bi-polar transistor, comprising:

a monocrystal substrate layer;

structured regions comprising a collector region and an insulation region surrounding the collector region atop the monocrystal substrate layer;

a base layer and, by means of epitaxy, a cap layer produced over the collector region;

an insulation layer deposited over the cap layer, the insulation layer being opened in an area of an effective emitter zone; and a poly-Si or an α-Si layer deposited and structured over the opened insulation layer, this layer then used as an emitter-doping agent source and as a contact layer, wherein, in an overlapping region between an edge of the emitter zone and an outer delimitation of the structured poly-silicon or α-silicon layer, the cap layer contains a doping profile, and the profile is low-doped on a base side thereof with a maximum doping concentration of $5 \times 10^{16}$ cm$^{-3}$ and highly doped on an emitter side thereof, and wherein the low-doped region of the cap layer has a thickness between 20 nm and 70 nm.

* * * * *